United States Patent
Hsieh et al.

(10) Patent No.: US 7,320,907 B2
(45) Date of Patent: Jan. 22, 2008

(54) METHOD FOR CONTROLLING LATTICE DEFECTS AT JUNCTION AND METHOD FOR FORMING LDD OR S/D REGIONS OF CMOS DEVICE

(75) Inventors: Ping-Pang Hsieh, Siaosinying (TW); Ji-Fu Kung, Miaoli (TW)

(73) Assignee: United Microelectronics Corp., Hsinchu (TW)

( * ) Notice: Subject to any disclaimer, the term of this patent is extended or adjusted under 35 U.S.C. 154(b) by 416 days.

(21) Appl. No.: 11/000,157

(22) Filed: Nov. 29, 2004

(65) Prior Publication Data

US 2006/0115969 A1    Jun. 1, 2006

(51) Int. Cl.
    *H01L 21/84*    (2006.01)
(52) U.S. Cl. .................. 438/166; 438/154; 438/301
(58) Field of Classification Search ............... 438/154, 438/163, 162, 166, 301, 303, 305, 306
See application file for complete search history.

(56) References Cited

U.S. PATENT DOCUMENTS

| | | | |
|---|---|---|---|
| 6,294,448 B1 * | 9/2001 | Chang et al. ............... 438/592 |
| 6,365,472 B1 * | 4/2002 | Ishimaru et al. ............ 438/301 |
| 6,548,361 B1 * | 4/2003 | En et al. ..................... 438/301 |
| 6,680,250 B1 * | 1/2004 | Paton et al. ................ 438/660 |
| 6,982,433 B2 * | 1/2006 | Hoffman et al. ............. 257/18 |

* cited by examiner

*Primary Examiner*—Kevin M. Picardat
(74) *Attorney, Agent, or Firm*—J.C. Patents

(57) ABSTRACT

A method for controlling lattice defects at a junction is described, which is used in accompany with an ion implantation step for forming a junction in a substrate and a subsequent annealing step. In the method, an extra implantation step is performed to increase the stress in the substrate apart from the junction, such that enhanced recrystallization is induced in the annealing step to lower the stress at the junction. The extra implantation step can be performed before or after the ion implantation step for forming the junction. A method for forming LDD or S/D regions of a CMOS device is also described, wherein at least one extra implantation step as mentioned above is performed before, between or after the ion implantation steps for forming the LDD or S/D regions of NMOS and PMOS transistors.

19 Claims, 3 Drawing Sheets

METHOD FOR CONTROLLING LATTICE DEFECTS AT JUNCTION AND METHOD FOR FORMING LDD OR S/D REGIONS OF CMOS DEVICE

BACKGROUND OF THE INVENTION

1. Field of the Invention

The present invention relates to a semiconductor process. More particularly, the present invention relates to a method for controlling lattice defects at a junction, and a method for forming lightly doped drain (LDD) or source/drain (S/D) regions of a CMOS device that incorporates the above method.

2. Description of the Related Art

As semiconductor devices are continuously scaled down, the affect of lattice defects in the semiconductor substrate becomes more and more significant. The lattice defects of a semiconductor material include mainly dislocation and stacking fault defects, which are caused by complex interaction of crystallization defects, metallic ions in the substrate, stress induced by ion implantation and the process thermal cycle. The major problem caused by the defects is extra current leakage, which is particularly large when the defects cross the LDD junction, S/D junction or well junction so that the circuit functionality or the yield is impacted.

Therefore, it is highly desirable to develop a method for reducing the dislocation and stacking fault defects in a semiconductor substrate. So far, there is no effective method for controlling formation of the defects.

SUMMARY OF THE INVENTION

In view of the foregoing, this invention provides a method for controlling the lattice defects at a junction to a lower density.

This invention also provides a method for forming LDD regions of a CMOS device and a method for forming S/D regions of a CMOS device, each of with incorporates the above method for controlling lattice defects at a junction.

The method for controlling lattice defects at a junction of this invention is used in accompany with an ion implantation step for forming a junction in a substrate and a subsequent annealing step. In the method, an extra implantation step is performed to increase the stress in the substrate apart from the position of the junction, such that enhanced recrystallization is induced in the annealing step to lower the stress at the junction.

In the above method, the extra implantation step is performed before or after the ion implantation step for forming the junction. Moreover, the implantation depth of the extra implantation is less than the depth of the junction. The junction is, for example, a lightly doped drain (LDD) junction or a source/drain (S/D) junction of a MOS transistor, a well junction, or any other PN junction.

The method for forming LDD or S/D regions of a CMOS device of the invention include usual lithographic steps and ion implantation steps for the NMOS and PMOS transistors and an annealing step for repairing the lattice of the substrate, and at least one extra implantation step as mentioned above. The extra implantation step may be performed only once before or after both of the LDD (or S/D) implantation steps of the NMOS and PMOS transistors, or between the LDD (or S/D) implantation step of the NMOS transistor and the LDD (or S/D) implantation step of the PMOS transistor. Alternatively, two extra implantation steps are performed for the NMOS transistor and PMOS transistor, respectively, so that the performances of the NMOS transistor and PMOS transistor can be optimized respectively.

Sine the extra implantation step causes enhanced recrystallization in the annealing step to lower the stress at the junction, less dislocation and stacking fault defects are present at the junction. Therefore, the junction current leakage can be reduced.

It is to be understood that both the foregoing general description and the following detailed description are exemplary, and are intended to provide further explanation of the invention as claimed.

DESCRIPTION OF THE PREFERRED EMBODIMENTS

First Embodiment

FIGS. 1-3 and 4A/B illustrate some exemplary methods for forming the LDD regions of a CMOS device according to the first embodiment of this invention. There are totally four examples illustrated in FIGS. 1, 2, 3 and 4A/B, respectively.

Figure 1:
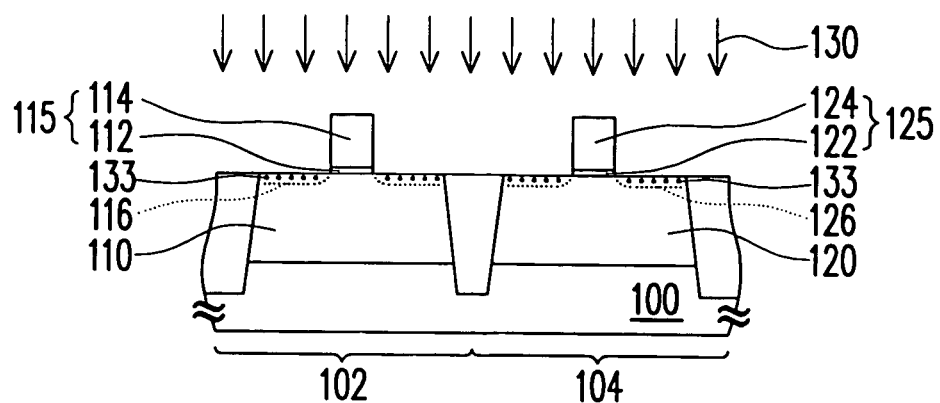
FIGS. 1-3 and 4A/B illustrate some exemplary methods for forming the LDD regions of a CMOS device according to a first embodiment of this invention.

Referring to FIG. 1, a semiconductor substrate 100 like a P-doped single-crystal silicon substrate is provided, having a P-well 110 and an N-well 120 therein and a NMOS gate 114 and a PMOS gate 124 thereon. The P-well 110 and the NMOS gate 114 are formed within a region predetermined for a NMOS transistor 102, and the N-well 120 and the PMOS gate 124 are formed within a region predetermined for a PMOS transistor 104. The NMOS gate 114 is separated from the substrate 100 by a gate insulator 112, and forms a NMOS gate structure 115 together with the gate insulator 112. The PMOS gate 124 is separated from the substrate 100 by a gate insulator 122, and forms a PMOS gate structure 125 together with the gate insulator 122. The NMOS and PMOS gate structures 115 and 125 are used as implantation masks in these examples.

In the example shown in FIG. 1, an extra implantation 130 as mentioned above is performed before both of the N-type LDD regions 116 and the P-type LDD regions 126 are formed, so the boundaries of the LDD regions 116 and 126 are shown in dotted lines in FIG. 1. The implantation depth of the extra implantation 130 is less than the predetermined depth of the junctions of the LDD regions 116 and 126, capable of producing lattice defects 133 including dislocation and stacking fault defects in the substrate 100 apart from the predetermined positions of the junctions of the NMOS and P-type LDD regions 116 and 126.

The ion used in the extra implantation 130 can be an N-type ion like phosphorous ion or arsenic ion, a P-type ion like boron ion or gallium ion, or an inert ion like carbon ion, silicon ion or germanium ion, according to the requirements of electrical properties of the CMOS device. The depth of the lattice defects 133 can be controlled by adjusting the implantation energy, and the distance between the LDD junction and the lattice defects 133 thus can be adjusted such that the enhanced recrystallization caused by the lattice defects 133 can effectively lower the stress at the junction.

The dosage of the extra implantation 130 can also be adjusted, according to the weight of the ion used and the requirements of electrical characteristics of the CMOS device. For example, the required implantation dosage when silicon ion is used is higher than that when germanium ion is used, since a silicon ion is lighter than a germanium ion to cause less lattice damage.

Figure 2:
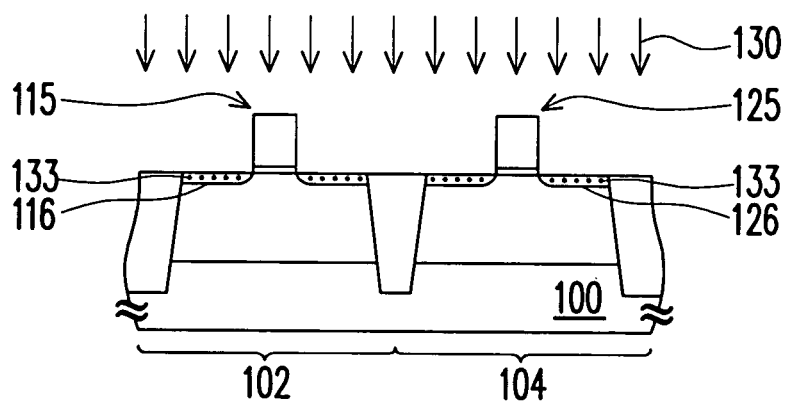

Referring to FIG. 2, in the second example, the extra implantation 130 is performed after both of the N-type LDD regions 116 and the P-type LDD regions 126 are formed. The order of performing the LDD implantation steps and the extra implantation step does not much affect the stress reduction effect of the extra implantation 130.

Figure 3:
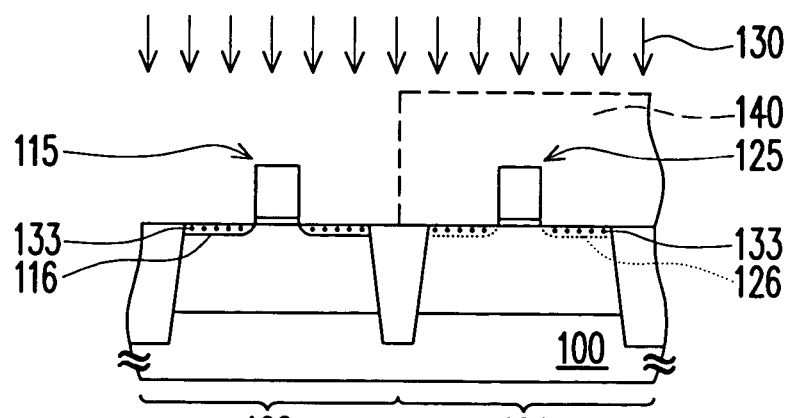

Referring to FIG. 3, in the third example, the extra implantation 130 is performed between the formation of the N-type LDD regions 116 and that of the P-type LDD regions 126. More specifically, in the case of FIG. 3 wherein the N-type LDD regions 116 are formed prior to the P-type LDD regions 126, the extra implantation 130 is performed after the N-type LDD regions 116 is formed and the implantation mask 140 for defining the same is removed, but before the P-type LDD regions 126 is formed. The order of performing the LDD implantation steps and the extra implantation step does not much affect the stress reduction effect of the extra implantation 130.

Analogously, in the cases wherein the P-type LDD regions are formed prior to the N-type LDD regions, the extra implantation can be performed after the P-type LDD regions are formed and the implantation mask for defining the same is removed, but before the N-type LDD regions are formed.

Figure 4A:
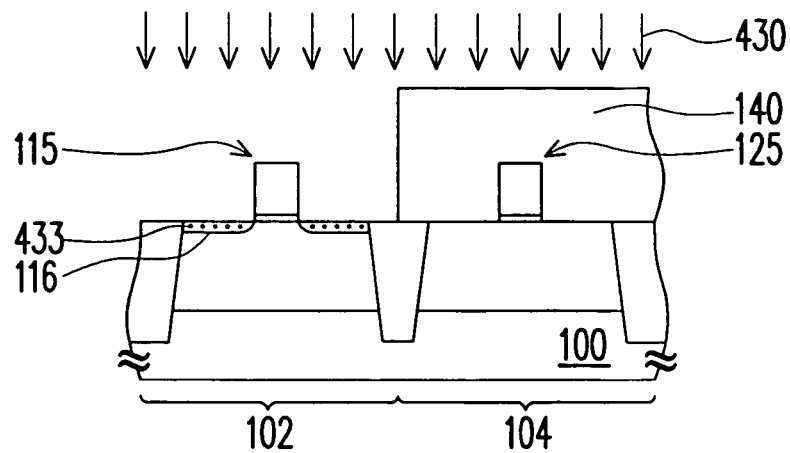
Figure 4B:
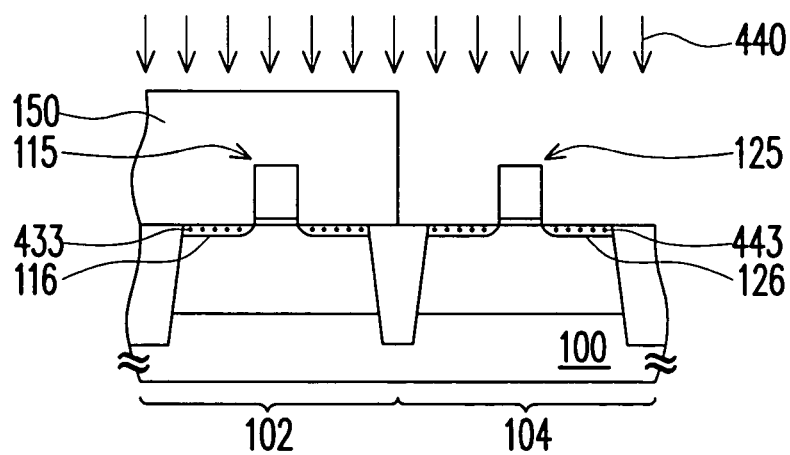

Referring to FIG. 4A/B, in the fourth example, two extra implantation steps 430 and 440 are performed to optimize the performances of the NMOS transistor and PMOS transistor respectively. The extra implantation step 430 for the N-type LDD regions 116 is performed using the implantation mask 140 of the N-type LDD regions 116 as a mask, producing lattice defects 433 in the substrate 100 apart from the position of the junctions of the N-type LDD regions 116. The extra implantation step 440 for the P-type LDD regions 126 is performed using the implantation mask 150 of the P-type LDD regions 126 as a mask, producing lattice defects 443 in the substrate 100 apart from the position of the junctions of the P-type LDD regions 126. Similarly, the extra implantation step 430 can be performed before or after the N-type LDD regions 116 are formed, and the extra implantation step 440 can be performed before or after the P-type LDD regions 126 are formed.

In this case, the two extra implantation steps 430 and 440 respectively may use an N-type, P-type or inert ion as mentioned above, according to the requirements of electrical properties of the CMOS device. Moreover, though the N-type LDD regions 116 are formed prior to the P-type LDD regions 126 in FIG. 4A/B, the above method with two extra implantation steps can also be readily applied to the cases wherein P-type LDD regions are formed prior to N-type LDD regions.

Since the extra implantation step(s) increases the stress in the substrate 100 apart from the junctions of the N-type and P-type LDD regions 116 and 126, the stress at the junctions can be lowered due to the enhanced recrystallization caused by the lattice defects in the subsequent annealing step. Consequently, less dislocation and stacking fault defects are present at the LDD junctions, and the current leakage at the LDD junctions can be reduced.

Second Embodiment

Figure 5:
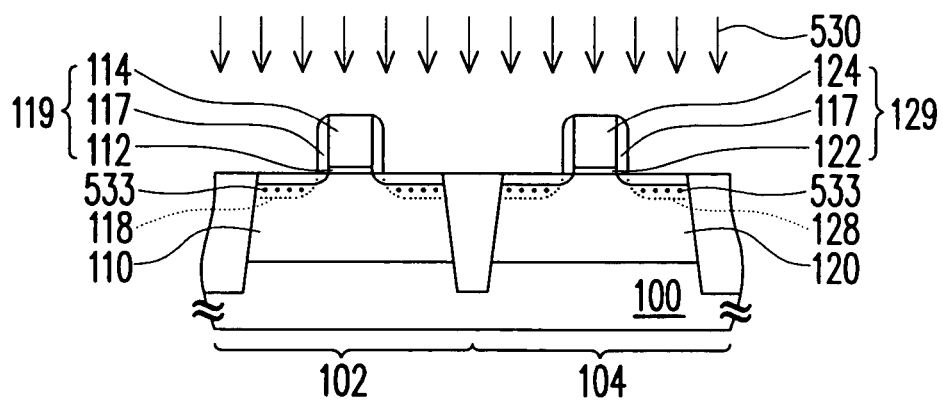
FIGS. 5, 6 and 7A/B illustrate some exemplary methods for forming the S/D regions of a CMOS device according to a second embodiment of this invention.
Figure 6:
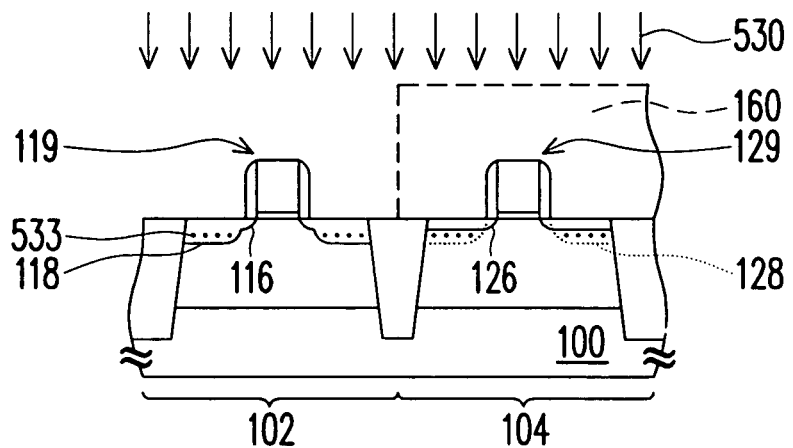
Figure 7A:
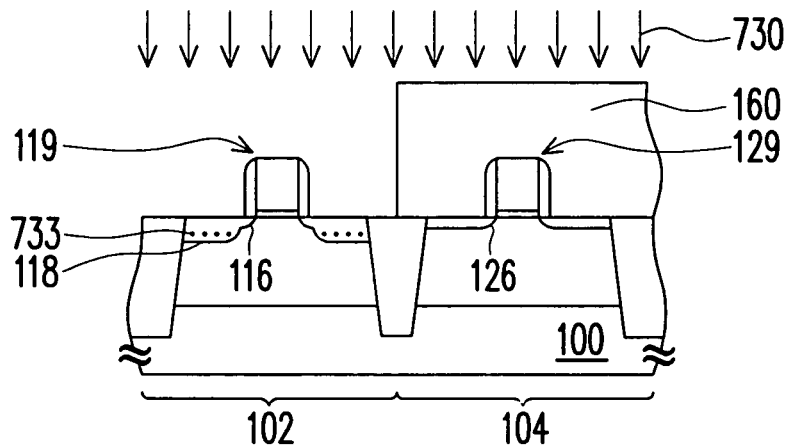
Figure 7B:
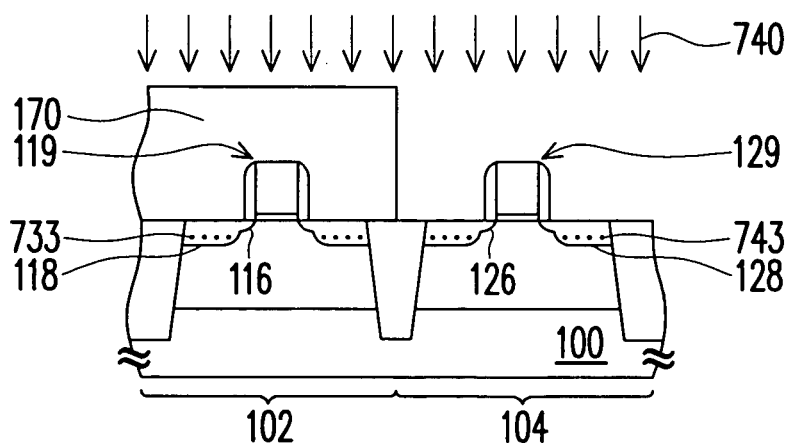

FIGS. 5, 6 and 7A/B illustrate some exemplary methods for forming the S/D regions of a CMOS device according to the second embodiment of this invention. There are totally three examples illustrated in FIGS. 5, 6 and 7A/B, respectively.

Referring to FIG. 5, after the N-type and P-type LDD regions 116 and 126 are formed, a spacer 117 is formed on the sidewall of each of the NMOS gate 114 and PMOS gate 124. The NMOS gate 114, the gate insulator 112 and the spacer 117 together constitute a NMOS gate structure 119, and the PMOS gate 124, the gate insulator 122 and the spacer 117 together constitute a PMOS gate structure 129. The NMOS and PMOS gate structures 119 and 129 are used as implantation masks in these examples.

In the example shown in FIG. 5, an extra implantation 530 as mentioned above is performed before both of the N-type and P-type S/D regions 118 and 128 are formed, so the boundaries of the S/D regions 118 and 128 are shown in dotted lines in FIG. 5. The implantation depth of the extra implantation 530 is less than the predetermined depth of the junctions of the S/D regions 118 and 128, capable of producing lattice defects 533 in the substrate 100 apart from the predetermined positions of the junctions. The ion used in the extra implantation 530 can be an N-type, P-type or inert ion as mentioned above, according to the requirements of electrical properties of the CMOS device.

Similar to the cases of LDD formation, the extra implantation 530 may alternatively be performed after both of the N-type and P-type S/D regions 118 and 128 are formed since the order of the step does not much affect the stress reduction effect of the extra implantation 530.

Referring to FIG. 6, in the second example, the extra implantation 530 is performed between the formation of the N-type S/D regions 118 and that of the P-type S/D regions 128. More specifically, in the case of FIG. 6 wherein the N-type S/D regions 118 are formed prior to the P-type S/D regions 128, the extra implantation 530 is performed after the N-type S/D regions 118 is formed and the implantation mask 160 for defining the same is removed, but before the P-type S/D regions 128 is formed.

Analogously, in the cases wherein the P-type S/D regions are formed prior to the N-type S/D regions, the extra implantation can be performed after the P-type S/D regions are formed and the implantation mask for defining the same is removed, but before the N-type S/D regions are formed.

Referring to FIG. 7A/B, in the third example, two extra implantation steps 730 and 740 are performed to optimize the performances of the NMOS transistor and PMOS transistor respectively. The extra implantation step 730 for the N-type S/D regions 118 is performed using the implantation mask 160 of the N-type S/D regions 118 as a mask, producing lattice defects 733 in the substrate 100 apart from the position of the junctions of the N-type S/D regions 118. The extra implantation step 740 for the P-type S/D regions 128 is performed using the implantation mask 170 of the P-type S/D regions 128 as a mask, producing lattice defects 743 in the substrate 100 apart from the position of the junctions of the P-type S/D regions 128. Similarly, the extra implantation step 730 can be performed before or after the N-type S/D regions 118 are formed, and the extra implantation step 740 can be performed before or after the P-type S/D regions 128 are formed.

In this case, each of the two extra implantation steps 730 and 740 may use an N-type, P-type or inert ion as mentioned above, according to the requirements of electrical properties of the CMOS device. Moreover, though the N-type S/D regions 118 are formed prior to the P-type S/D regions 128 in FIG. 7A/B, the above method with two extra implantation steps can also be readily applied to the cases wherein P-type S/D regions are formed prior to N-type S/D regions.

Since the extra implantation step(s) increases the stress in the substrate 100 apart from the junctions of the N-type and P-type S/D regions 118 and 128, the stress at the junctions can be lowered due to the enhanced recrystallization caused by the lattice defects in the subsequent annealing step. Consequently, less dislocation and stacking fault defects are present at the S/D junctions, and the current leakage at the S/D junctions can be reduced.

In addition, though the LDD regions are formed prior to the S/D regions in the first and second embodiments, the method of this invention can also be readily applied to the cases wherein the gate spacers and the S/D regions are formed earlier and the LDD regions are formed after the gate spacers are removed. In such cases, the extra implantation step(s) for the S/D regions are performed prior to the extra implantation step(s) for the LDD.

Moreover, though the methods for forming LDD or S/D regions are taken as examples in the above embodiments, the stress reduction method of this invention may be readily applied to a process of forming a well junction or any other PN junction. Similarly, the extra implantation step can be performed before, during or after the ion implantation process for forming the junction.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for controlling lattice defects at a junction, used in accompany with an ion implantation step for forming a junction in a substrate and a subsequent annealing step, and comprising:
    performing an extra implantation step to increase the stress in the substrate apart from a position of the junction, such that enhanced recrystallization is induced in the annealing step to lower the stress at the junction, wherein the extra implantation step is performed before the ion implantation step for forming the junction.

2. The method of claim 1, wherein the extra implantation step is performed before or after the ion implantation step for forming the junction.

3. The method of claim 1, wherein the extra implantation step uses an N-type, P-type or inert ion.

4. The method of claim 1, wherein the junction is a lightly doped drain (LDD) junction or source/drain (S/D) junction of a MOS transistor, or a well junction.

5. A method for forming LDD regions of a CMOS device, comprising:
    providing a substrate with a NMOS gate structure and a PMOS gate structure formed thereon, wherein each gate structure comprises a gate and a gate dielectric layer;
    forming an N-type LDD region in the substrate beside the NMOS gate structure;
    forming a P-type LDD region in the substrate beside the PMOS gate structure;
    performing at least one extra implantation step to increase the stress in the substrate apart from positions of junctions of the N-type and P-type LDD regions; and
    performing an annealing step to repair the lattice of the substrate,
    wherein the at least one extra implantation step is performed such that enhanced recrystallization is induced in the annealing step to lower the stress at the junctions of the N-type and P-type LDD regions.

6. The method of claim 5, wherein the extra implantation step is performed only once before both of the N-type and P-type LDD regions are formed.

7. The method of claim 5, wherein the extra implantation step is performed only once after both of the N-type and P-type LDD regions are formed.

8. The method of claim 5, wherein
    the N-type LDD region is formed before or after the P-type LDD region; and
    the extra implantation step is performed only once between the step of forming the N-type LDD region and the step of forming the P-type LDD region.

9. The method of claim 5, wherein the at least one extra implantation step uses an N-type, P-type or inert ion.

10. The method of claim 5, wherein
    the N-type LDD region is formed before or after the P-type LDD region;
    two extra implantation steps are performed, including a first extra implantation step that uses a first mask for forming the N-type LDD region as a mask and a second extra implantation step that uses a second mask for forming the P-type LDD region as a mask; and
    the first extra implantation step is performed before or after the N-type LDD region is formed, and the second extra implantation step is performed before or after the P-type LDD region is formed.

11. The method of claim 10, wherein the first and second extra implantation steps respectively use an N-type, P-type or inert ion.

12. A method for forming S/D regions of a CMOS device, comprising:
    providing a substrate with a NMOS gate structure and a PMOS gate structure formed thereon, wherein each gate structure comprises a gate and a gate dielectric layer;
    forming N-type S/D regions in the substrate beside the NMOS gate structure;
    forming P-type S/D regions in the substrate beside the PMOS gate structure;
    performing at least one extra implantation step to increase the stress in the substrate apart from positions of junctions of the S/D regions, wherein the extra implantation step is performed before the N-type S/D region is formed or P-type S/D region is formed; and
    performing an annealing step to repair the lattice of the substrate,
    wherein the at least one extra implantation step is performed such that enhanced recrystallization is induced in the annealing step to lower the stress at the junctions of the N-type and P-type S/D regions.

13. The method of claim 12, wherein
    each of the NMOS gate structure and the PMOS gate structure further comprises a spacer on a sidewall of the gate; and
    the substrate provided further includes an N-type LDD region beside the gate of the NMOS gate structure and a P-type LDD region beside the gate of the PMOS gate structure.

14. The method of claim 12, wherein the extra implantation step is performed only once before both of the N-type and P-type S/D regions are formed.

15. The method of claim 12, wherein the extra implantation step is performed only once after both of the N-type and P-type S/D regions are formed.

16. The method of claim 12, wherein
the N-type S/D region is formed before or after the P-type S/D region; and
the extra implantation step is performed only once between the step of forming the N-type S/D region and the step of forming the P-type S/D region.

17. The method of claim 12, wherein the at least one extra implantation step uses an N-type, P-type or inert ion.

18. The method of claim 12, wherein
the N-type S/D region is formed before or after the P-type S/D region; and
two extra implantation steps are performed, including a first extra implantation step that uses a first mask for fonning the N-type S/D region as a mask and a second extra implantation step that uses a second mask for forming the P-type S/D region as a mask; and
the first extra implantation step is performed before the N-type S/D region is formed, and the second extra implantation step is performed before the P-type S/D region is formed.

19. The method of claim 18, wherein the first and second extra implantation steps respectively use an N-type, P-type or inert ion.

* * * * *